United States Patent
Ngo et al.

(10) Patent No.: US 6,383,880 B1
(45) Date of Patent: May 7, 2002

(54) NH3/N2-PLASMA TREATMENT FOR REDUCED NICKEL SILICIDE BRIDGING

(75) Inventors: Minh Van Ngo, Fremont; Christy Mei-Chu Woo, Cupertino; Robert A. Huertas, Hollister, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/679,374

(22) Filed: Oct. 5, 2000

(51) Int. Cl.[7] .................. H01L 21/336; H01L 21/44
(52) U.S. Cl. ........................ 438/303; 438/655
(58) Field of Search .................. 438/597, 303, 438/301, 583, 636, 655, 651, 798, 961, FOR 199, FOR 401

(56) References Cited

U.S. PATENT DOCUMENTS 5,861,329 A * 1/1999 Yeh et al. ............. 438/232
5,952,706 A * 9/1999 Bashir .................. 257/559
6,096,662 A * 8/2000 Ngo et al. ............. 438/221
6,162,717 A * 12/2000 Yeh ..................... 438/265
6,171,919 B1 * 1/2001 Besser et al. .......... 438/305
6,255,179 B1 * 7/2001 Cantell et al. ......... 438/301
6,323,519 B1 * 11/2001 Gardner et al. ........ 257/336

FOREIGN PATENT DOCUMENTS

| JP | 03105916 | * 5/1991 | ............ H01L/21/28 |
| JP | 04255216 | * 9/1992 | ......... H01L/21/302 |

* cited by examiner

Primary Examiner—Charles Bowers
Assistant Examiner—Brook Kebede

(57) ABSTRACT

Bridging between nickel silicide layers on a gate electrode and source/drain regions along silicon nitride sidewall spacers is prevented by treating the exposed surfaces of the silicon nitride sidewall spacers with a plasma containing ammonia and nitrogen to create a clean surface region having increased nitrogen. Embodiments include treating the silicon nitride sidewall spacers with an ammonia and nitrogen plasma to reduce the refractive index of the surface region to less than about 1.95.

17 Claims, 3 Drawing Sheets

NH3/N2-PLASMA TREATMENT FOR REDUCED NICKEL SILICIDE BRIDGING

RELATED APPLICATIONS

This application contains subject matter to subject matter disclosed in copending U.S. patent applications: Ser. No. 09/679,372, filed on Oct. 5, 2000; U.S. Ser. No. 09/679,373, filed on Oct. 5, 2000; U.S. Ser. No. 09/679,375, filed on Oct. 5, 2000; U.S. Ser. No. 09/679,871, filed on Oct. 5, 2000; and U.S. Ser. No. 09/679,880, filed on Oct. 5, 2000.

TECHNICAL FIELD

The present invention relates to the fabrication of semiconductor devices, particularly to self-aligned silicide (salicide) technology, and the resulting semiconductor devices. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate exhibiting the requisite reliability. High performance microprocessor applications require rapid speed of semiconductor circuitry. The speed of semiconductor circuitry varies inversely with the resistance (R) and capacitance (C) of the interconnection system. The higher the value of the RxC product, the more limiting the circuit operating speed. Miniaturization requires long interconnects having small contacts and small cross-sections. Accordingly, continuing reduction in design rules into the deep submicron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicides have been employed in salicide technology, such as titanium, tungsten, and cobalt. Nickel, however, offers particularly advantages vis-à-vis other metals in salicide technology. Nickel requires a lower thermal budget in that nickel silicide and can be formed in a sifigle heating step at a relatively low temperature of about 250° C. to about 600° C. with an attendant reduction in consumption of silicon in the substrate, thereby enabling the formation of ultra-shallow source/drain junctions.

In conventional salicide technology, a layer of the metal is deposited on the gate electrode and on the exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it was also found advantageous to employ silicon nitride sidewall spacers, since silicon nitride is highly conformal and enhances device performance, particularly for p-type transistors. However, although silicon nitride spacers are advantageous from such processing standpoints, it was found extremely difficult to effect nickel silicidation of the gate electrode and source/drain regions without undesirable nickel silicide bridging and, hence, short circuiting, therebetween along the surface of the silicon nitride sidewall spacers.

Accordingly, there exists a need for salicide methodology enabling the implementation of nickel silicide interconnection systems without bridging between the nickel silicide layers on the gate electrode and the source/drain regions, particularly when employing silicon nitride sidewall spacers on the gate electrode.

DISCLOSURE OF THE INVENTION

An advantage of the present invention is a method of manufacturing a semiconductor device having nickel silicide contacts on a gate electrode and associated source/drain regions without bridging therebetween along insulative sidewall spacers, notably silicon nitride sidewall spacers.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon gate electrode having opposing side surfaces on a substrate with a gate insulating layer therebetween; forming silicon nitride sidewall spacers on the opposing side surfaces of the gate electrode leaving exposed adjacent surfaces of the substrate; treating exposed surfaces of the silicon nitride sidewall spacers with a plasma containing ammonia and nitrogen; depositing a layer of nickel on the gate electrode and on the exposed substrate surfaces; and heating to react the layer of nickel with underlying silicon to form a layer of nickel silicide on the gate electrode and layers of nickel silicide on the exposed surfaces of the substrate.

Embodiments of the present invention include forming the silicon nitride sidewall spacers with a refractive index of about 1.95 to about 2.02. Treatment with the plasma containing ammonia and nitrogen also forms a surface layer rich in nitrogen, i.e., deficient in silicon, at a thickness of about 1000 Å to about 400 Å and having a refractive index less than about 1.95. Embodiments of the present invention further include forming an oxide liner on the opposing side surfaces of the gate electrode prior to forming the silicon nitride sidewall spacers, and forming the nickel silicide layers at a temperature of about 400° C. to about 600° C.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
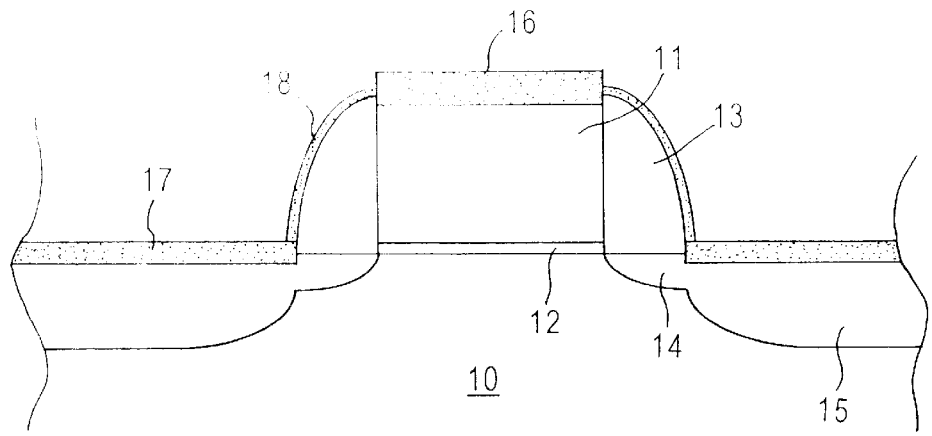
FIG. 1 schematically illustrates problematic nickel silicide bridging attendant upon implementing nickel salicide methodology with silicon nitride sidewall spacers conventional practices.
Figure 2:
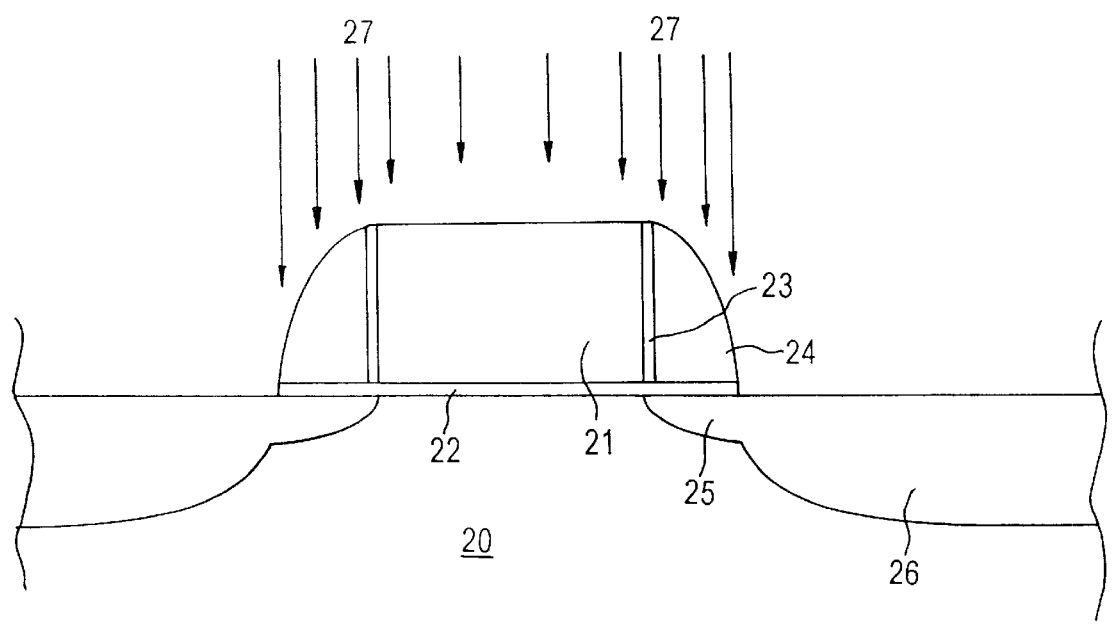
FIGS. 2–5 schematically illustrate sequential phases in accordance with an embodiment of the present invention, wherein like features are denoted by like reference numerals.

The present invention addresses and solves problems attendant upon implementing conventional salicide technology employing nickel as the metal for silicidation. As device geometries shrink into the deep sub-micron regime, nickel silicide bridging occurs along the surface of silicon nitride sidewall spacers between the nickel silicide layer on the gate electrode and nickel silicide layers on associated source/drain regions. For example, adverting to FIG. 1, in attempting to implement nickel salicide technology utilizing silicon nitride sidewall spacers, a gate electrode 11 is formed on substrate 10 with gate insulating layer 12 therebetween. A conformal layer of silicon nitride is then deposited followed by anisotropic etching to form silicon nitride spacers 13 on opposing side surfaces of gate electrode 11. Sputter etching in argon was then conducted to remove the thin oxide layer from the exposed surfaces of silicon nitride sidewall spacers 13, from the upper surface of gate electrode and from the exposed surface of substrate 10. Shallow source/drain extensions 14 and source/drain regions 15 were formed in a conventional manner. A layer of nickel was deposited followed by heating resulting in the formation of a nickel silicide layer 16 on the upper surface of gate electrode 11 and a layer of nickel silicide 17 on associated source/drain regions 15. However, it was found that a thin layer of nickel silicide 18, as at a thickness of about 30 Å to 60 Å, undesirably formed along the exposed surfaces of the silicon nitride sidewall spacers 13 causing bridging and, hence, shorting between nickel silicide layer 16 and nickel silicide layers 17.

After considerable experimentation and investigation, it was postulated that the problem of nickel silicide formation 18 along the silicon nitride sidewall spacers 13 stemmed from the reaction of nickel with dangling silicon bonds in the silicon nitride sidewall spacer. Upon further experimentation and investigation, it was postulated that the argon sputter etching technique employed to remove the thin oxide film sensitized the exposed surfaces of silicon nitride spacers 13, thereby enhancing the reactivity of silicon with deposited nickel to disadvantageously form the thin layer of nickel silicide 18 on silicon nitride sidewall spacers 13.

In accordance with embodiments of the present invention, sputter etching to remove the thin oxide film is omitted. It was found that such plasma treatment also advantageously increases the amount of nitrogen on the exposed surfaces of the silicon nitride sidewall spacers forming a nitrogen-rich/silicon-starved surface region lower in silicon having dangling bonds. In other words, treatment of the exposed surfaces of the silicon nitride sidewall spacers in a plasma containing ammonia and nitrogen not only removes the thin oxide film but results in the formation of a nitrogen-rich/silicon-starved surface region having less silicon with dangling bonds than the remainder of the silicon nitride sidewall spacer. By removing the oxide film without sensitizing the exposed surfaces of the silicon nitride sidewall spacers and creating a nitrogen-rich/silicon-starved surface region, reaction between deposited nickel and silicon in the sidewall spacers is reduced, thereby avoiding nickel silicide bridging.

Conventional silicon nitride sidewall spacers exhibit a refractive index of about 1.98 to about 2.02, e.g., about 2. If the amount of silicon with dangling bonds is reduced, the refractive index is also reduced. Accordingly, embodiments of the present invention comprise treating the exposed surfaces of the silicon nitride sidewall spacers in an ammonia/nitrogen plasma to remove the thin oxide film thereon, and to reduce the number of silicon dangling bonds creating a nitrogen-rich/silicon starved surface region exhibiting a refractive index less than about 1.95, such as about 1.75 to about 1.95, e.g., about 1.85. Such a nitrogen-rich/silicon-starved surface region with reduced silicon dangling bonds and reduced refractive index typically has a thickness of about 100 Å to about 400 Å, e.g., about 300 Å.

Given the disclosed objectives and guidance of the present disclosure, the optimum conditions for plasma treatment of the silicon nitride sidewall spacers can be determined in a particular situation. For example, it was found suitable to plasma treat the silicon nitride sidewall spacers with an ammonia flow rate of about 2,000 to about 4,000 sccm, a nitrogen flow rate of about 2,000 to about 4,000 sccm, a RF power of about 1,000 to about 1,200 watts, a pressure of about 2.0 to about 2.8 Torr., and a temperature of about 390° C. to about 420° C., typically for about 10 seconds to about 60 seconds. Advantageously, such plasma treatment of the surface of the silicon nitride sidewall spacers avoids sensitizing the exposed surfaces and creates an excess amount of nitrogen such that there is virtually no free silicon available to react with nickel deposited during the subsequent nickel deposition stage. Accordingly, embodiments of the present invention enable nickel silicidation without undesirable bridging, such as that denoted by reference numeral 18 in FIG. 1.

An embodiment of the present invention is schematically illustrated in FIGS. 2 through 5, wherein similar reference numerals denote similar features. Adverting to FIG. 2, a gate electrode 21, e.g., doped polycrystalline silicon, is formed on semiconductor substrate 20, which can be n-type or p-type, with a gate insulating layer 22 therebetween. Gate insulating layer 22 is typically silicon dioxide formed by thermal oxidation or chemical vapor deposition (CVD). In accordance with embodiments of the present invention, a thin oxide liner 23, as at a thickness of about 130 Å to about 170 Å, is formed on the opposing side surfaces of gate electrode 21. Silicon oxide liner can be formed by plasma enhanced chemical vapor deposition (PECVD) using silane at a flow rate of about 50 to about 100 sccm, N$_2$O at a flow rate of about 1,000 to about 4,000 sccm, an RF power of about 100 watts to about 300 watts, a pressure of about 2.4 Torr. to about 3.2 Torr., and a temperature of about 380° C. to about 420° C., e.g., about 400° C. Silicon oxide liner 23 advantageously prevents consumption of the gate electrode 21 by silicidation from the side surfaces thereof.

Subsequent to forming silicon oxide liner 23, silicon nitride sidewall spacers 24 are formed by depositing a conformal layer and anisotropically etching. Silicon nitride sidewall spacers can be formed by PECVD employing a silane flow rate of about 200 to about 400 sccm, e.g., about 375 sccm, a nitrogen flow rate of about 2,000 to about 4,000 sccm, e.g., about 2,800 sccm, an ammonia flow rate of about 2,500 to about 4,000 sccm, e.g., about 3,000 sccm, a high frequency RF power of about 250 watts to about 450 watts, e.g., about 350 watts, a low frequency RF power of about 100 to about 200 watts, e.g., about 140 watts, a pressure of about 1.6 Torr. to about 2.2 Torr., e.g., about 1.9 Torr., and a temperature of about 380° C. to about 420° C., e.g., about 400° C. The silicon nitride sidewall spacers 24 typically have a thickness of about 850 Å to about 950 Å and exhibit a refractive index of about 1.98 about 2.02, e.g., about 2.0.

Figure 3:
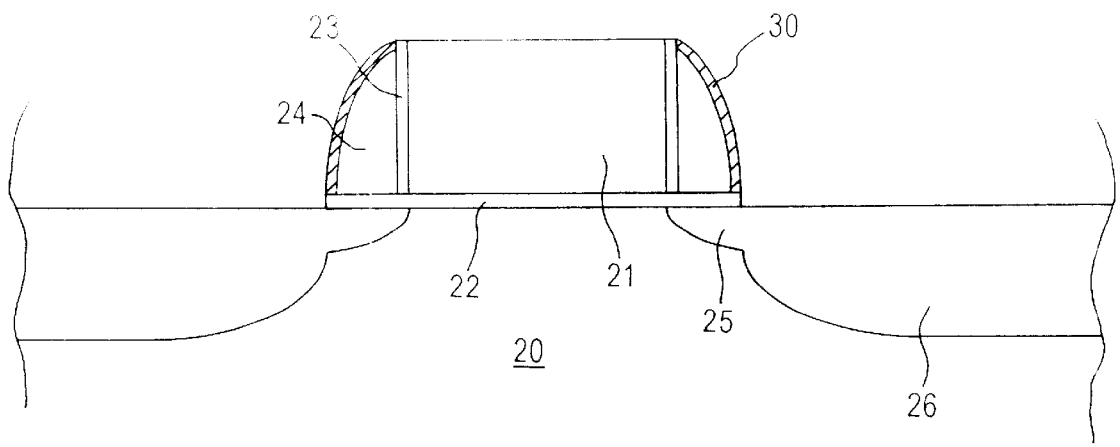
Figure 4:
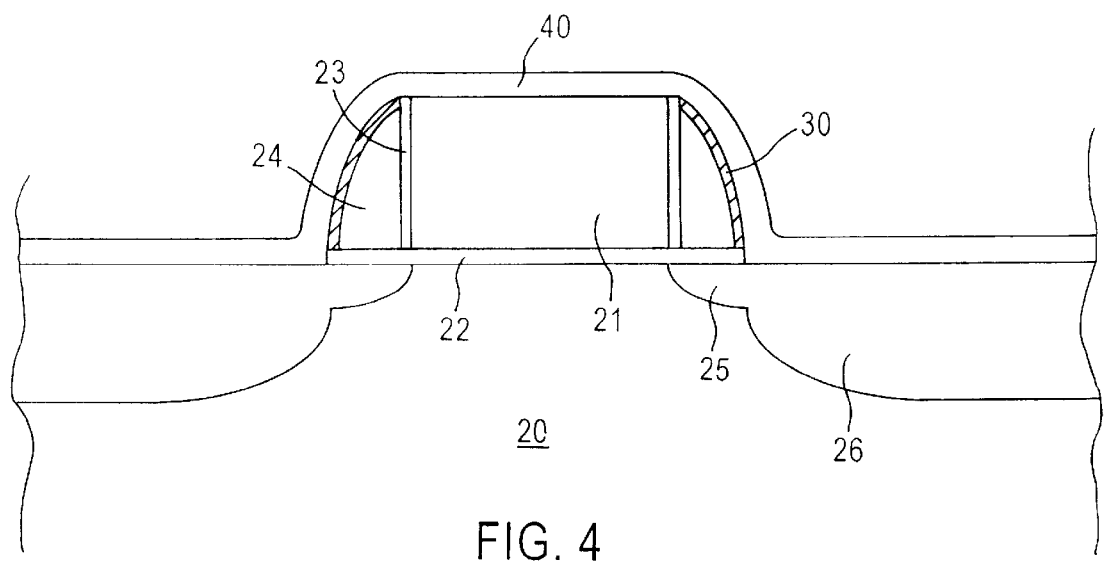

Therefore, in accordance with embodiments of the present invention, the silicon nitride sidewall spacers 24 are treated in an ammonia/nitrogen plasma, as illustrated by arrows 27. Treatment in an ammonia/nitrogen plasma can be conducted at an ammonia flow rate of about 2,000 to about 4,000 sccm, a nitrogen flow rate of about 2,000 to about 4,000 sccm, a temperature of about 380° C. to about 420° C., a RF power of about 1,000 watts to about 1,200 watts, e.g., a pressure of about 2.0 to a about 2.8 Torr. as for about 10 seconds to about 60 seconds. As shown in FIG. 3, treatment of the silicon nitride sidewall spacers 24 with the ammonia/nitrogen plasma 27 results in the formation of a surface region 30 having a thickness of about 100 Å to about 400 Å, e.g., about 300 Å. Surface region 30 vis-à-vis the remainder of the silicon nitride sidewall spacer 24, has a higher nitrogen concentration and lower silicon concentration. The surface region 30 typically has a refractive index of about 1.75 to about 1.95, e.g., about 1.85 vis-à-vis a refractive index of about 1.98 to about 2.02, e.g., about 2, for the remainder of silicon nitride sidewall spacer 24. Subsequently, a conformal layer of nickel 40 is deposited, as at a thickness of about 100 Å to about 300 Å, e.g., about 200 Å.

Figure 5:
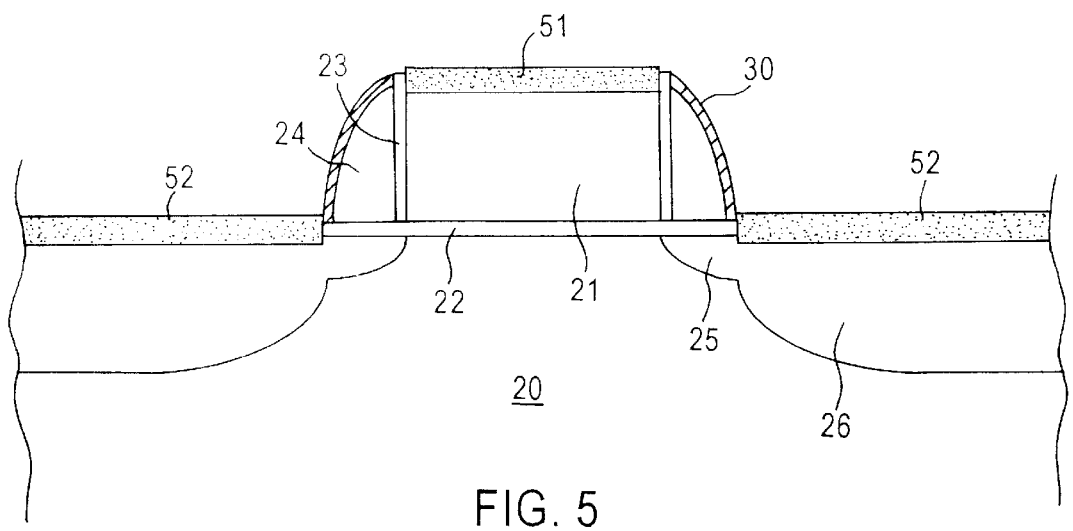

Rapid thermal annealing, as at a temperature of about 250° C. to about 600° C., e.g., about 400° C. to about 600° C., is then conducted during which nickel silicide layer 51, illustrated in FIG. 5, is formed on gate electrode 21 while nickel silicide layers 52 are formed on exposed portions of the substrate adjacent sidewall spacers 24. The nickel silicide layers typically have a thickness of about 100 Å to about 300 Å, e.g., about 200 Å. By avoiding sensitization of silicon and forming a nitrogen-rich/silicon-starved surface region 30 on silicon nitride sidewall spacers 24, reaction of nickel layer 40 with silicon in sidewall spacers 24 is effectively prevented. Accordingly, the inventive methodology avoids the formation of nickel silicide on the silicon nitride sidewall spacers 24 and, hence, prevents bridging between nickel silicide layer 51 on the upper surface of gate electrode 21 and nickel silicide layers 52 on the exposed surfaces of the silicon substrate adjacent silicon nitride sidewall spacers 24. In addition, the oxide liner 23 contributes to the prevention of such bridging. Unreacted nickel on the surfaces of the silicon nitride sidewall spacers 24 is then easily removed, as by a wet processing technique, e.g., treating with a mixture of sulfuric acid and hydrogen peroxide with a ratio of sulfuric acid: hydrogen peroxide of about 1:12 to about 1:4, e.g., about 1:2.

The present invention, therefore, enables the implementation of nickel salicide methodology, advantageously utilizing silicon nitride sidewall spacers without bridging between the nickel silicide layer formed on the upper surface of the gate electrode and the nickel silicide layers formed on associated source/drain regions. The present invention is applicable to the production of any of various types of semiconductor devices. The present invention is particularly applicable in manufacturing semiconductor devices with high circuit speeds having design features in the deep submicron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a silicon gate electrode, having opposing side surfaces, on a substrate with a gate insulating layer therebetween;

forming silicon nitride sidewall spacers on the opposing side surfaces of the gate electrode leaving exposed adjacent surfaces of the substrate;

treating exposed surfaces of the silicon nitride sidewall spacers with a plasma containing ammonia and nitrogen;

depositing a layer of nickel on the gate electrode and exposed surfaces of the substrate; and heating to react the layer of nickel with underlying silicon to form a layer of nickel silicide on the gate electrode and layers of nickel silicide on the exposed surfaces of the substrate.

2. The method according to claim 1, comprising forming the silicon nitride sidewall spacers with a refractive index of about 1.98 to about 2.02.

3. The method according to claim 1, comprising treating the exposed surfaces of the silicon nitride sidewall spacers with the plasma containing ammonia and nitrogen to remove any oxide layer on the exposed surfaces thereof.

4. The method according to claim 1, comprising treating the exposed surfaces of the silicon nitride sidewall spacers with the plasma containing ammonia and nitrogen to reduce the refractive index of the exposed surfaces, thereby substantially preventing the formation of nickel silicide on the sidewall spacers upon heating to react nickel the underlying silicon.

5. The method according to claim 4, comprising treating the exposed surfaces of the silicon nitride sidewall spacers with the plasma containing ammonia and nitrogen to reduce the refractive index of the exposed surface to less than about 1.95.

6. The method according to claim 5, comprising treating the exposed surfaces of the silicon nitride sidewall spacers with the plasma containing ammonia and nitrogen to form a surface region having a thickness of about 100 Å to about 400 Å with the refractive index less than about 1.95.

7. The method according to claim 3, comprising treating the exposed surfaces of the silicon nitride sidewall spacers with the plasma containing ammonia and nitrogen at:

an ammonia flow rate of about 2,000 to about 4,000 sccm;

a nitrogen flow rate of about 2,000 to about 4,000 sccm;

a RF power of about 1,000 to about 1,200 watts;

a pressure of about 2 to about 2.8 Torr.; and a temperature of about 380° C. to about 420° C.

8. The method according to claim 7, comprising treating the silicon nitride sidewall spacers with the nitrogen plasma for about 10 seconds to about 60 seconds.

9. The method according to claim 3, comprising forming the silicon nitride sidewall spacers at a thickness of about 850 Å to about 950 Å.

10. The method according to claim 3, comprising forming source/drain regions in the substrate proximate the opposing side surfaces of the gate electrode, wherein the nickel silicide layers on the exposed substrate surfaces function as source/drain contacts.

11. The method according to claim 10, comprising forming an oxide liner on the opposing side surfaces of the gate electrode before forming the silicon nitride sidewall spacers.

12. The method according to claim 11, comprising forming the oxide liner at a thickness of about 130 Å to about 170 Å.

13. The method according to claim 11, comprising depositing the layer of nickel at a thickness of about 100 Å to about 300 Å.

14. The method according to claim 1, wherein the silicon nitride sidewall spacers are not subjected to sputter etching in argon prior to depositing the layer of nickel.

15. The method according to claim 11, comprising heating at a temperature of about 400° C. to about 600° C. to form the layers of nickel silicide.

16. The method according to claim 11, comprising removing unreacted nickel from the silicon nitride sidewall spacers.

17. The method according to claim 16, comprising removing unreacted nickel from the silicon nitride sidewall spacers with a mixture comprising sulfuric acid and hydrogen peroxide.

* * * * *